(12) United States Patent
Mader et al.

(10) Patent No.: US 7,412,123 B1
(45) Date of Patent: Aug. 12, 2008

(54) HYBRID FREE SPACE FIBER BACKPLANE

(75) Inventors: Tom Mader, Los Gatos, CA (US); Christine Krause, Boulder Creek, CA (US); Hengju Cheng, Mountain View, CA (US); Jamyuen Ko, Irvine, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/751,910

(22) Filed: May 22, 2007

(51) Int. Cl.
*G02B 6/12* (2006.01)

(52) U.S. Cl. ............................. 385/14; 385/24; 385/129

(58) Field of Classification Search .................. 385/14, 385/129, 24
See application file for complete search history.

(56) References Cited

U.S. PATENT DOCUMENTS 4,872,739 A * 10/1989 Kahn et al. .................... 385/24

\* cited by examiner

*Primary Examiner*—Jennifer Doan
(74) *Attorney, Agent, or Firm*—Kenneth J. Cool; Cool Patent, P.C.

(57) ABSTRACT

Briefly, in accordance with one or more embodiments, a backplane includes one or more optical links and is capable of receiving one or more circuit cards. Optical signals sent via the optical links may at least partially travel in a free space region between optical elements of the circuit cards and the optical links. Optical signals may also traverse the free space between optical links in the absence of a circuit card wherein the optical signal may travel to one or more other circuit cards on the backplane. As a result, in one or more embodiments a network between one or more of the circuit cards on the backplane may be automatically configured even in the absence of one or more circuit cards from the backplane.

13 Claims, 2 Drawing Sheets

HYBRID FREE SPACE FIBER BACKPLANE

BACKGROUND

Figure 1:
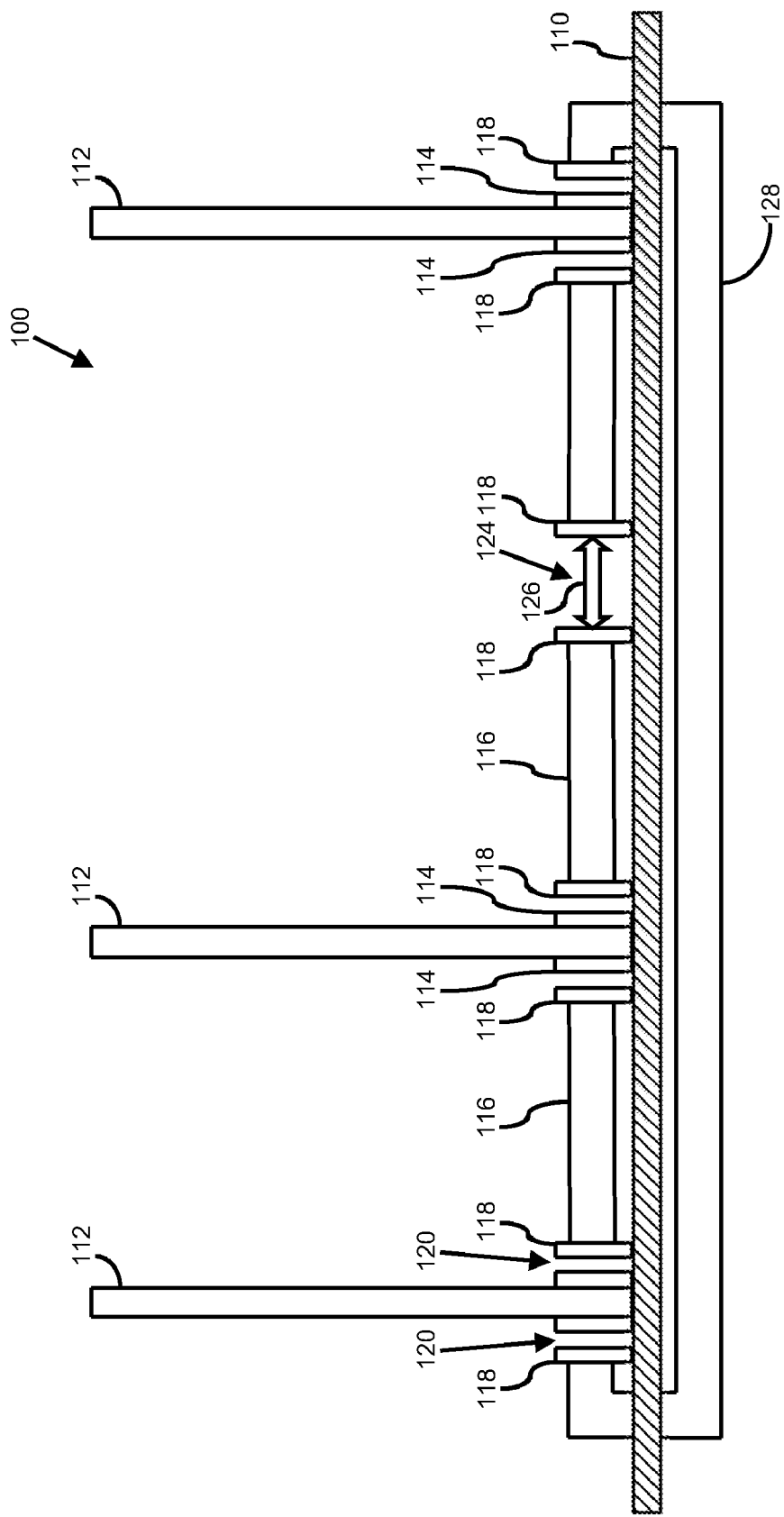

Backplane systems such as blade servers typically utilize copper traces on printed circuit board backplanes. As data rates increase to 10 gigabytes per second and greater on copper traces and as system densities increase, fundamental challenges emerge with higher-frequency electrical losses, electrical reflections and power dissipation, especially with advanced modulation formats and equalization required for higher speed copper transmission systems.

DESCRIPTION OF THE DRAWING FIGURES

Figure 2:
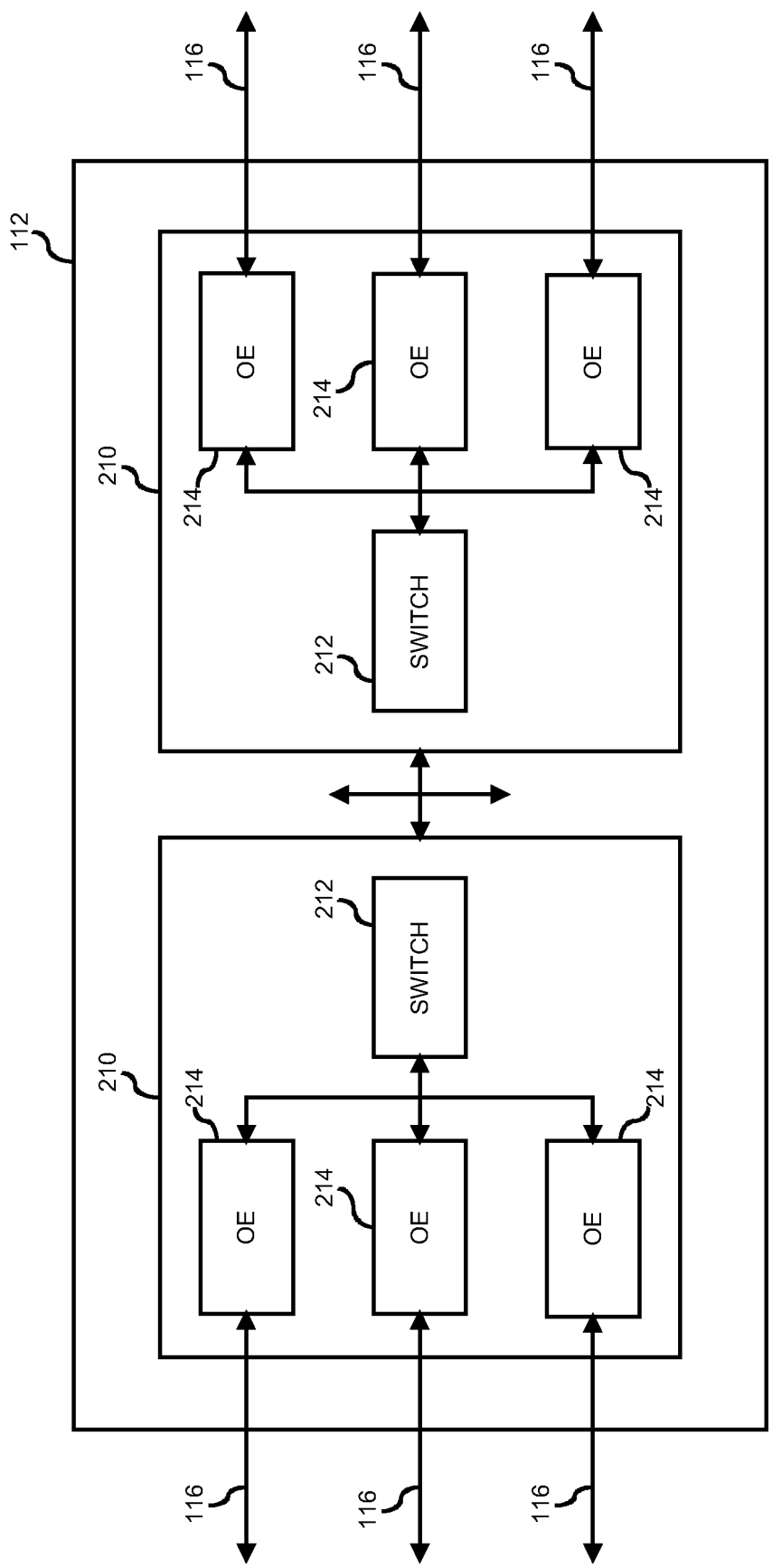

Claimed subject matter is particularly pointed out and distinctly claimed in the concluding portion of the specification. However, such subject matter may be understood by reference to the following detailed description when read with the accompanying drawings in which:

FIG. 1 is a diagram of a backplane system having optical links to couple one or more circuit boards in accordance with one or more embodiments; and FIG. 2 is a block diagram of a circuit board of FIG. 1 capable of aggregating one or more optical links in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

Referring now to FIG. 1, a diagram of a backplane system having optical links to couple one or more circuit boards in accordance with one or more embodiments will be discussed. As shown in FIG. 1, a backplane system 100 may comprise backplane 110 capable of having one or more circuit boards 112 being coupled to backplane 110. In one or more embodiments, backplane 110 may include one or more receptacles (not shown) for mechanically receiving circuit boards 112. Such receptacles may provide mechanical connections to physically retain and secure circuit boards 112 on backplane 110 while facilitating insertion and removal of circuit boards 112 into the receptacles for example as the capability of backplane is increased by adding additional circuit boards 112, or to replace one or more faulty circuit boards 112 with one or more replacement circuit boards 112. Furthermore, the receptacles may also include electrical connections to electrically couple one or more circuits or devices of circuit cards 112 to one or more connections or circuits of backplane 110. In one or more embodiments, backplane system 100 may comprise a server type system and one or more of circuit boards 112 may comprise server blades. One or more of circuit cards 112 may comprise a management module capable of managing one or more other circuit cards 112 disposed in backplane system 100. Backplane system 100 may comprise various other types of systems, for example telecommunication type systems, routers, switches, network cards, and so on. As an example, one or more of circuit cards 112 may comprise a radio controller for a broadband communication system such as a Worldwide Interoperability for Microwave Access (WiMAX) type system or the like. However, these are merely example types of systems for backplane system 100, and the scope of the claimed subject matter is not limited in these respects.

In one or more embodiments, backplane 110 includes one or more optical links 116 for coupling one or more of circuit boards 112 via optical signals. One or more of optical links 116 may include one more lenses 118 disposed at one or more ends of optical links 116 for focusing light passing between circuit boards 112 and optical links 116. In one or more embodiments, optical links 116 may comprise optical fiber to operate as an optical waveguides for optical signals transmitted between circuit boards 112. In one embodiment, one or more optical links 116 may comprise single mode fiber (SMF) and in an alternative embodiment one or more optical links 116 may comprise multi mode fiber (MMF). Circuit boards 112 may include one or more optical elements 114 for transmitting optical signals between circuit boards 112 via optical links 116. Optical elements 114 may comprise lasing elements such as a vertical-cavity surface-emitting laser (VCSEL) type laser for emitting converting electrical signals of optical cards 112 as laser light. Furthermore, optical elements 114 may comprise optical detector elements such as a positive-intrinsic-negative (PIN) type diode capable of generating electrical signals in response to an optical signal impinging upon the diode. However, these are merely example devices for optical elements 114, and the scope of the claimed subject matter is not limited in these respects.

In one or more embodiments, backplane 110 may include a return optical link 128 to optionally couple circuit boards in a ring type network arrangement. In one or more embodiments, such a network arrangement may comprise a token-ring type network. In one or more embodiments, the network arrangement may comprise a star-type network. In embodiments where backplane system 100 comprises a storage type system, the arrangement may comprise a Fibre Channel type system. In one or more embodiments, one or more circuit cards 112 may comprise mass storage such hard disk drives, coupled in a Redundant Array of Independent Drives (RAID) type arrangement. However, these are merely example arrangement of the topological connections between circuit boards 112 of backplane system 100, and the scope of the claimed subject matter is not limited in these respects.

In one or more embodiments, backplane system 100 may comprise a hybrid free space and transmission line optical communication system. In such an arrangement, lenses 118 of optical links 116 may abut against lenses 114 of circuit cards 112 having one or more optical elements disposed thereon. In some embodiments, light traveling between lenses 118 and lenses 114 may traverse free space regions 120 disposed between lenses 118 and lenses 114. Free space region 120 may comprise a relatively smaller distance, and in some instances the distance may be zero or near zero if lenses 118 abut lenses 114. Coupling between lenses 114 and lenses 118 may occur with relatively lower loss within an acceptable range. In one or more embodiments, free space region 120 may comprise a distance of 10 millimeters or less. Optical signals may be routed on backplane 110 between one or more circuit boards 112 via optical links 116. One or more of circuit cards 112 need not be physically present on backplane 110 to couple one or more other circuit boards 112 that are present on backplane 110. For example, at circuit board location 124, when a circuit board 112 is not disposed on backplane 110 at location 124, light may traverse the free space region 126 at location 124 between adjacent optical links 116 with relatively low or no loss as the distance between lenses 118 of adjacent optical links 116 may be relatively smaller, for example not much greater than a thickness of circuit board 112. In such an arrangement, a circuit board 112 need not be physically present at location 124 on backplane in order for one or more other circuit boards 112 to be optically coupled via optical links 116.

In such an arrangement, optical signals may also traverse the free space 126 at location 124 between optical links in the absence of a circuit card 112 wherein the optical signal may travel to one or more other circuit cards 112 on backplane 110. As a result, in one or more embodiments a network between one or more of circuit cards 112 on backplane 110 may be automatically configured even in the absence of one or more circuit cards 112 from backplane 110. Such an arrangement may further obviate the need for physical connectors for the modules of circuit boards 112, thereby facilitating insertion and/or removal of circuit boards onto or from backplane 110, while still providing higher quality optical links 116 for example via optical fibers or other types of wave guides between circuit cards 112 for at least a portion, and/or a substantial portion, of the distance between circuit cards 112. Such optical links 116 may allow higher frequency signals to be transmitted between circuit boards 112 without the higher frequency loss, reflections, and/or power dissipation that may occur with electrical type links between circuit boards 112. Furthermore, as shown in FIG. 2, one or more optical links 116 may be disposed between adjacent circuit boards 112, for example to aggregate the bandwidth of individual optical links 116 to provide even greater bandwidth between circuit boards 112.

Referring now to FIG. 2, a block diagram of a circuit board of FIG. 1 capable of aggregating one or more optical links in accordance with one or more embodiments will be discussed. As shown in FIG. 2, circuit board 112 may be capable of communicating one or more other circuit boards 112 of backplane 110 of backplane system 100. In general, backplane system 100 may benefit from using optical connectors that are smaller than electrical connectors for very high speed aggregate interconnect bandwidths, and fibers can be routed away from airflow paths to enhance thermal design, for example one or more holes may be cut into backplane 110 to allow more efficient cooling.

In one or more embodiments, circuit board 112 may include one or more monolithic photonic integrated circuits or hybrid integrated circuits (PIC) 214 that may include multiple optical elements 214 to couple to multiple optical links 116, for example to provide aggregate bandwidth of two or more of the optical links 116. PIC 214 may further include one or more electrical circuits such as switch 212 for example to provide switching and/or routing functions of optical signals carried over optical links 116. In one or more embodiments using multi mode fiber (MMF), data rates on the order of about 10 gigabits per second or higher may be achieved using a single ring network. In such embodiments, multiple such rings may be duplicated, for example, by implementing a dual ring network topology, for redundancy. Since optical links 116 and lenses may be relatively physically smaller sized, multiple MMF optical links 116 and lenses 118 may be utilized in parallel to achieve aggregate data rates, for example on the order of 40 gigabits per second to about 100 gigabits per second or great in a ring type network topology for backplane system 100, although the scope of the claimed subject matter is not limited in these respects.

In one or more embodiments using single mode fiber (SMF), extremely higher data rates may be achieved via monolithic photonic integrated circuits (PIC) such as PICs 210. In such embodiments, the light from optical links 116 may be coupled into and/or out of the waveguides disposed on such PIC type devices such as PICs 210. By utilizing such an arrangement, data rates on the order of about several terabits per second are capable of being can being achieved via wavelength division multiplexing (WDM) and/or optical time division multiplexing (OTDM) type optical aggregation technologies or the like. Furthermore, signal pass through, optical switching and/or routing type functions may likewise be achieved. For example very higher-speed direct connections may be established between any two of circuit cards 112 via utilization of specific wavelengths and/or optical switches 212 inside of the PIC devices 210. Such an architecture utilizing PIC devices 210 may be utilized to implement ring type networks, star type networks, and or adaptive mesh type networks via utilization of monolithic dense wavelength division multiplexing (DWDM) and/or optical switching devices. However, these are merely examples of how optical signals in backplane system 100 may be aggregated and/or multiplexed, and the scope of the claimed subject matter is not limited in these respects.

Although the claimed subject matter has been described with a certain degree of particularity, it should be recognized that elements thereof may be altered by persons skilled in the art without departing from the spirit and/or scope of claimed subject matter. It is believed that the subject matter pertaining to hybrid free space fiber backplane and/or many of its attendant utilities will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A backplane system, comprising:
   a backplane capable of receiving one or more circuit cards to connect to the backplane; and
   one or more optical links disposed on the backplane, the optical links having one or more lenses disposed to couple light between an optical element of a circuit card coupled to the backplane wherein the light at least partially travels in free space between the optical element and a lens of an optical link;
   wherein one or more of the circuit cards are capable of being coupled in a ring type network, a token-ring type network, star type network, or a mesh type network, or combinations thereof, via one or more of the optical links.

2. A backplane system as claimed in claim 1, wherein the light is capable of traveling in free space between a first optical link and a second optical link in a location where a circuit card may be disposed on the backplane in the absence of the circuit card.

3. A backplane system as claimed in claim 1, further comprising a return optical link disposed on the backplane to couple one or more of the circuit cards in a ring type topology.

4. A backplane system as claimed in claim 1, wherein one or more of the optical links comprises single mode fiber or multimode fiber, or combinations thereof.

5. A backplane system as claimed in claim 1, wherein one or more optical elements of one or more of the circuit cards comprises a VCSEL, a PIN diode, or a photonic integrated circuit, or combinations thereof.

6. A backplane system as claimed in claim 1, wherein the optical links are capable of providing one or more redundant optical paths.

7. A backplane system as claimed in claim 1, wherein one or more of the circuit cards comprises a management module for the backplane system.

8. A backplane system as claimed in claim 1, wherein one or more of the circuit cards comprises a photonic integrated circuit capable of implementing wavelength division multiplexing, dense wavelength division multiplexing, or optical time division multiplexing, or combinations thereof.

9. A backplane system as claimed in claim 1, wherein one or more of the circuit cards are capable of implementing a pass through function, an optical switching function, or a routing function, or combinations thereof, of optical signals traveling via the one or more optical links.

10. A backplane system as claimed in claim 1, wherein one or more of the circuit cards comprises a server blade, a switch, a router, a storage card, a network access card, a RAID card, a Fibre Channel card, or a radio network card, or combinations thereof.

11. A circuit card, comprising:
a circuit disposed thereon; and
one or more optical elements disposed thereon, the one or more optical elements being capable of communicating with the circuit and one or more other circuit cards via an optical link disposed in proximity to the circuit card, wherein at least a portion of the optical signal comprises light capable of traveling in a free space region between the optical link and the one or more optical elements without requiring a physical connection between the optical link and the one or more optical elements;
wherein one or more of the optical elements are disposed on a photonic integrated circuit of the circuit card, the photonic integrated circuit being capable of implementing wavelength division multiplexing dense wavelength division multiplexing or optical time division multiplexing or combinations thereof.

12. A circuit card as claimed in claim 11, wherein one or more of the optical elements are disposed on a photonic integrated circuit.

13. A circuit card as claimed in claim 10, wherein one or more of the optical elements are disposed on a photonic integrated circuit, the photonic integrated circuit being capable of implementing a bandwidth aggregation function, a pass through function, a switching function, or a routing function, or combinations thereof, of one or more optical signals communicated between one or more of the optical elements and one or more optical links.

* * * * *